United States Patent [19]
Bondur et al.

[11] 4,104,086
[45] Aug. 1, 1978

[54] METHOD FOR FORMING ISOLATED REGIONS OF SILICON UTILIZING REACTIVE ION ETCHING

[75] Inventors: James Allan Bondur, Walden; Hans Bernhard Pogge, Hopewell Junction, both of N.Y.

[73] Assignee: International Business Machines Corporation, Armonk, N.Y.

[21] Appl. No.: 824,361

[22] Filed: Aug. 15, 1977

[51] Int. Cl.² ............... H01L 21/76; H01L 27/00
[52] U.S. Cl. ............... 148/1.5; 29/576 W; 29/578; 29/580; 148/175; 148/187; 156/643; 156/648; 156/649; 156/653; 156/662; 204/192 E; 204/192 EC; 357/49; 357/50
[58] Field of Search ............... 148/1.5, 175, 187; 156/643, 653, 648, 649, 662; 29/576 W, 578, 580; 357/49, 50; 204/192 E, 192 EC

[56] References Cited

U.S. PATENT DOCUMENTS

| | | | |
|---|---|---|---|
| 3,500,139 | 3/1970 | Frouin et al. | 357/49 X |
| 3,508,980 | 4/1970 | Jackson et al. | 148/175 |
| 3,575,731 | 4/1971 | Hoshi et al. | 148/1.5 |
| 3,577,044 | 5/1971 | Armstrong et al. | 357/49 |
| 3,901,737 | 8/1975 | Dash | 148/1.5 |
| 3,966,577 | 6/1976 | Hochberg | 204/192 E |
| 3,979,237 | 9/1976 | Morcom et al. | 148/187 X |
| 4,007,104 | 2/1977 | Summers et al. | 156/643 X |

OTHER PUBLICATIONS

Doo et al., "Making Monolithic ... Insulation Isolation Techniques", I.B.M. Tech. Discl. Bull., vol. 8, No. 4, Sep. 165, pp. 659–660.
Abbas; S. A., "Recessed Oxide Isolation Process", Ibid., vol. 20, No. 1, Jun. 1977, pp. 144–145.
Bondur; J. A., "Dry Process Tech. Creative Ion Etching", J. Vac. Sci. Technol., vol. 13, No. 5, Sep./Oct. 1976, pp. 1023–1029.
Bersin; R. L., "Survey of Plasma-Etching Processes", Solid State Technol., May, 1976, pp. 31–36.

Primary Examiner—R. Dean
Assistant Examiner—W. G. Saba
Attorney, Agent, or Firm—George O. Saile

[57] ABSTRACT

A method for isolating regions of silicon involving the formation of openings that have a suitable taper in a block of silicon, thermally oxidizing the surfaces of the openings, and filling the openings with a dielectric material to isolate regions of silicon within the silicon block. The method is particularly useful wherein the openings are made through a region of silicon having a layer of a high doping conductivity.

21 Claims, 14 Drawing Figures

METHOD FOR FORMING ISOLATED REGIONS OF SILICON UTILIZING REACTIVE ION ETCHING

BACKGROUND OF THE INVENTION

The invention relates to methods for dielectrically isolating regions of monocrystalline silicon from other regions of monocrystalline silicon.

DESCRIPTION OF THE PRIOR ART

In the monolithic integrated circuit technology, it is usually necessary to isolate various active and passive elements from one another in the integrated circuit structure. These devices have been isolated by backbiasing, PN junctions, partial dielectric isolation and complete dielectric isolation. The dielectric materials used have been silicon dioxide, glass, and so forth. The preferred isolation for these active devices and circuits is some form of dielectric isolation. The dielectric isolation has the substantial advantage over the PN junction isolation because it allows the butting of the circuit elements against the isolation and thereby result in greater density of packing of the active and passive devices on the integrated circuit chip.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves. The usual protective layer is a silicon nitride, silicon dioxide sandwich layer. Following the formation of the grooves by conventional chemical etching, the silicon body is subjected to a conventional oxidation step whereby the silicon in the groove area is oxidized and the silicon dioxide fills up the groove as well as oxidizing further into the silicon to form the isolation region. One of the major problems with this process is what is known as "bird's beak".

The "bird's beak" is a non-planar silicon dioxide formation at the top periphery of the groove and is caused by the lateral oxidation underneath the silicon nitride layer. Since the oxidation of a specific thickness of silicon requires an almost equivalent amount of free space to expand into, and since the $Si_3N_4$ limits the unrestricted expansion, the result is an up-pushing of the silicon nitride at the edge of the groove. The final consequence of this is a general stress in the perimeter region of the groove as well as difficulties in subsequently achieving good butted diffusions against the vertical portion of the silicon dioxide. This non-butting capability defeats a major benefit of the original purpose of the silicon dioxide region. This process is described more fully by E. Kooi U.S. Pat. No. 3,970,486, Clevenger U.S. Pat. No. 3,534,234, Peltzer U.S. Pat. No. 3,648,125 and I. Magdo et al., patent application Ser. No. 150,609, filed June 7, 1971.

Another technique for forming dielectric isolation is described in the V. Y. Doo U.S. Pat. No. 3,386,865 and "A Composite Insulator-Junction Isolation" by R. E. Jones and V. Y. Doo, published in Electrochemical Technology, Vol. 5, No. 5-6, May-June 1967, pp. 308-310. This technique involves the formation of a silicon dioxide layer or similar type of layer on the substrate in the region where dielectric isolation is desired. An epitaxial layer is grown upon the substrate in all regions except where the silicon dioxide is located. The surface of the epitaxial layer and the sides of the openings are partially thermally oxidized. The openings are then filled by vapor deposition of polycrystalline silicon, silicon dioxide or similar materials. This technique has some disadvantages. Selective epitaxy, as required by this technique, is very sensitive to the area relationship between silicon dioxide and silicon regions. For example, two different size silicon regions would tend to fill in at a different rate so that at the end of a process, the regions are filled in to a different extent. Also, in mesa-type depositions, crystallographic faceting tends to occur. This results in pyramid-like growth and tends to widen the isolation regions beyond the original lithography capabilities. The slanted silicon/silicon dioxide interface will again cause difficulties in achieving reliable butted diffusion against the silicon dioxide region.

The formation of grooves and the filling of such grooves have been described by other publications such as the G. L. Kuhn, U.S. Pat. Nos. 3,892,608 and 3,969,168. In these patents, chemical etching is used to form a V groove, a rounded bottom groove or a rectangular evacuated space. There is little detail as to how the groove is formed but it is clear that the groove would be limited by the nature of the chemical etching step. The process does not necessarily yield a planar surface and it requires photolithography after the formation of the grooves. D. K. Roberson U.S. Pat. No. 3,956,033 describes a similar chemical etch followed by filling with polycrystalline silicon. Here again, the groove is limited by the chemical etching technique and it is unclear how the overgrowth of the polysilicon is removed. U.S. Patents K. E. Bean et al. No. 3,725,160 and W. R. Morcom et al. No. 3,979,237 also show filling of grooves. In these patents, the effect of chemical etching is more clearly brought out where it is shown that monocrystalline silicon are preferentially etched chemically to provide grooves having symmetrical sidewalls sloped at precise angles depending upon the particular face crystal to which the silicon surface is aligned.

The Brand U.S. Pat. No. 3,979,765 also describes the chemical etching to open rectangular grooves and the filling of the grooves with insulator material. However, it is difficult to understand how some of the principal steps such as etching and filling are actually effected from the description.

The formation of rectangular grooves have been made in the Hochberg U.S. Pat. No. 3,966,577 and T. Kaji et al. U.S. Pat. No. 3,997,378 and S. A. Abbas, IBM TDB Vol. 20, No. 1, p.144, June 1977 entitled "Recessed Oxide Isolation Process", by reactive ion etching techniques. None of these references describe the problems and detailed solutions for forming reactive ion etched grooves in silicon. Neither do they involve themselves with the problem of effectively filling the groove to form the best possible isolation for the silicon regions. There are descriptions of the reactive ion etching processes in the "A Survey of Plasma-etching Processes", R. L. Bersin, published in Solid State Technology, May 19, 1976, pp. 31-36 and particularly for silicon in J. M. Harvilchuck patent application Ser. No. 594,413, filed July 9, 1975, now abandoned, for "Reactive Ion Etching of Silicon". However, the details of the reactive ion etching in these publications do not show how the reactive ion etching would be utilized in the formation of dielectric isolation.

SUMMARY OF THE PRESENT INVENTION

In accordance with the present invention, a method for forming dielectric isolation is described wherein tapered sided isolation structures are formed in a specific manner. In the present text, we use openings, channels, holes, grooves and trenches interchangeably. Tapered sided openings of less than about 4 micrometers in width at the surface are formed in a silicon body in the areas where dielectric isolation is desired. The formation of the tapered openings is by reactive ion etching. The taper of the tapersided openings can be from near vertical to as much as 20° from the vertical and terminates into the substantially flat bottom of the openings. The surfaces of the openings are then thermally oxidized to silicon dioxide. The oxidized openings are filled with a suitable dielectric material to fully isolate the regions of silicon. The dielectric material from above the surface of the body is removed to provide uniformly filled isolation pockets at the surface of the silicon body. The precise taper of the opening is important so as to balance the need for greater density of devices against the completeness of groove filling by the CVD method. Grooves of insufficient taper will exhibit a CVD $SiO_2$ which could contain an opening or poor quality dielectric region in the center of the filled groove.

The method for dielectrically isolating regions of silicon further overcomes the problem of reactive ion etching through the silicon body which is composed of a layer of highly doped silicon. The highly doped silicon is etched more isotropically under most conditions of the reactive ion etching than regions of lower doping. The conditions of reactive ion etching through such a highly doped layer of silicon involves the use of a reactive chlorine specie ambient having a pressure of between about 2 to b 50 micrometers with the chlorine specie percentage in the gas of between about 2 to 10 and etch rate of between about 0.03 and 0.08 micrometers.

DESCRIPTION OF THE PREFERRED EMBODIMENTS

Referring now particularly to FIGS. 1A-1E, the manufacturing steps for the dielectric isolation of one form of the invention are shown. The structure of FIG. 1A includes the monocrystalline silicon substrate 10 which is shown as P− conductivity for illustration purposes, an N+ layer 12 over the substrate 10 and an N− conductivity layer 14 on the layer 12. For the purposes of the invention, either all or some of the layers 10, 12 and 14 could be of opposite conductivity from the conductivity types indicated. However, it is preferred to have the layer 12 to be in a high conductivity region where it will ultimately be the collector of a bipolar transistor. This structure can be fabricated by various techniques. However, the preferred technique is to provide a P− monocrystalline silicon substrate and to diffuse an N+ blanket diffusion into the substrate by using conventional diffusion or ion implantation of an N type impurity such as arsenic, antimony or phosphorus to produce an N+ region with a surface concentration of between about $1 \times 10^{19}$ or $1 \times 10^{21}$ atoms/cc. The layer 14 is subsequently grown onto the 10, 12 structure by means of epitaxial growth. This may be done by conventional techniques such as the use of $SiCL_4/H_2$ or $SiH_4/H_2$ mixtures at growth temperatures of about 1000° C to 1200° C. The N+ layer may have a typical thickness of between about 1–3 microns whereas the epitaxial layer has a thickness of from 0.5 to 10 microns, the exact thicknesses depending upon the device to be built.

Alternatively the structure could be made by various combinations of thermal diffusion, ion implantation and/or epitaxial growth which would include the formation of a varied subcollector region where subsequent formation of bipolar devices is desired.

In certain device structures, buried highly doped regions or layers are not necessary and can therefore be omitted. This would be true for FET type devices. Alternatively, multiple buried highly doped regions of different dopant types could be formed by multiple epitaxial and diffusion processing. These structures could be needed for buried subcollector, as well as buried conductor lines.

Figure 1A:
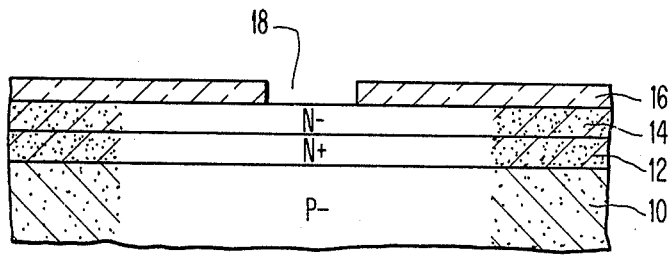
FIGS. 1A – 1E illustrate a method for forming the dielectric isolated structure of the invention.
Figure 1B:
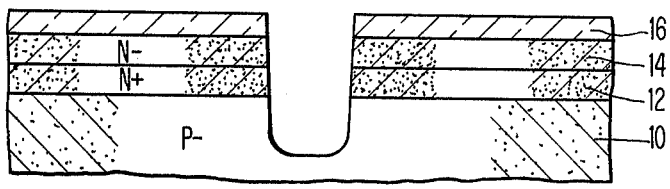

The next series of steps shown in FIGS. 1A and 1B are directed to the technique for reactive ion etching of tapered sidewall openings or channels in the silicon structure. A silicon dioxide layer 16 is formed by the conventional techniques of either thermal growth at a temperature of 970° C in a wet or dry oxygen ambient or by chemical vapor deposition. Other mask materials can also be used such as silicon nitride and aluminum oxide or combinations thereof and so forth. Openings 18 are formed in the oxide in the regions where dielectric isolation is desired. These openings are formed by the conventional photolithography and etching techniques.

The FIG. 1A structure is now ready for the reactive ion etching process. This process may be more fully understood by reference to the J. M. Harvilchuck et al patent application referred to above. The RF induced plasma is reactive chlorine, bromine or iodine specie as specified in the Harvilchuck patent application. The thickness of the masking layer 16 is between about 2,000 to 20,000Angstroms, the exact thickness depending on the depth requirement of the silicon groove. The precise description of the RF glow discharge apparatus is given in the beforementioned patent application. The reactive ion etch or plasma ambient is preferably a combination of an inert gas such as argon and a chlorine specie. Application of suitable power in the order of about 0.1 to 0.75 watts/cm$^2$ from an RF voltage source will produce sufficient power density to cause the reactive ion etching operation of silicon to be carried out at a rate of about 0.02 to 0.08 micrometers per minute. The desired result of the etching is shown in FIG. 1B wherein the openings or channels at least partially penetrate through the P− conductivity region 10. The channels or openings may go substantially through the N+ region 12.

It is important that the openings or channels be tapered at greater than about 2° from the vertical. This is because the subsequent dielectric filling deposition process results in a slightly thicker deposition near the top of the groove as opposed to the bottom of the groove. Thus, in case of vertical grooves, there is at one stage, an overgrowth of the remaining narrow groove which results in poor dielectric material quality in the region below the overgrown area. In case of a sufficiently tapered groove, the groove is filled up from the bottom. The preferred amount of taper, adequate for appropriate chemical vapor deposition filling of a dielectric material such as silicon dioxide will in part depend on the groove width as will become clear from FIG. 6. The taper of much greater than 20° from the vertical will take up an undue amount of space on the surface of the semiconductor device. This formation of the tapered structure depends upon two principal items. The primary influence on the sidewall formation is the angle of the sidewall of the masking layer 16 in the opening 18. The second dependence is upon the etch rate difference between the masking material and the substrate material. The higher substrate/masking material etch rate ratio favors the more vertical walls in the silicon substrate.

Standard lithography techniques tend to result in slightly tapered resist window openings. When reactive ion etching is used to open the underlying silicon dioxide film through these tapered resist windows, and when the etch rate ratio between the resist and silicon dioxide is near unity, the taper of the resist window is transferred to the silicon dioxide window. This taper is then, in turn, transferred into the silicon unless a high etch rate ratio exists between silicon and silicon dioxide. The taper in silicon dioxide mask is preferably within the range of 5° to 20° from vertical. If the lithography process permits vertical resist window openings, then the silicon dioxide window opening is vertical and under such conditions the tapered shape of the silicon opening would tend to be near vertical and generally insensitive to the etch rate ratio between silicon and silicon dioxide.

Figure 2:
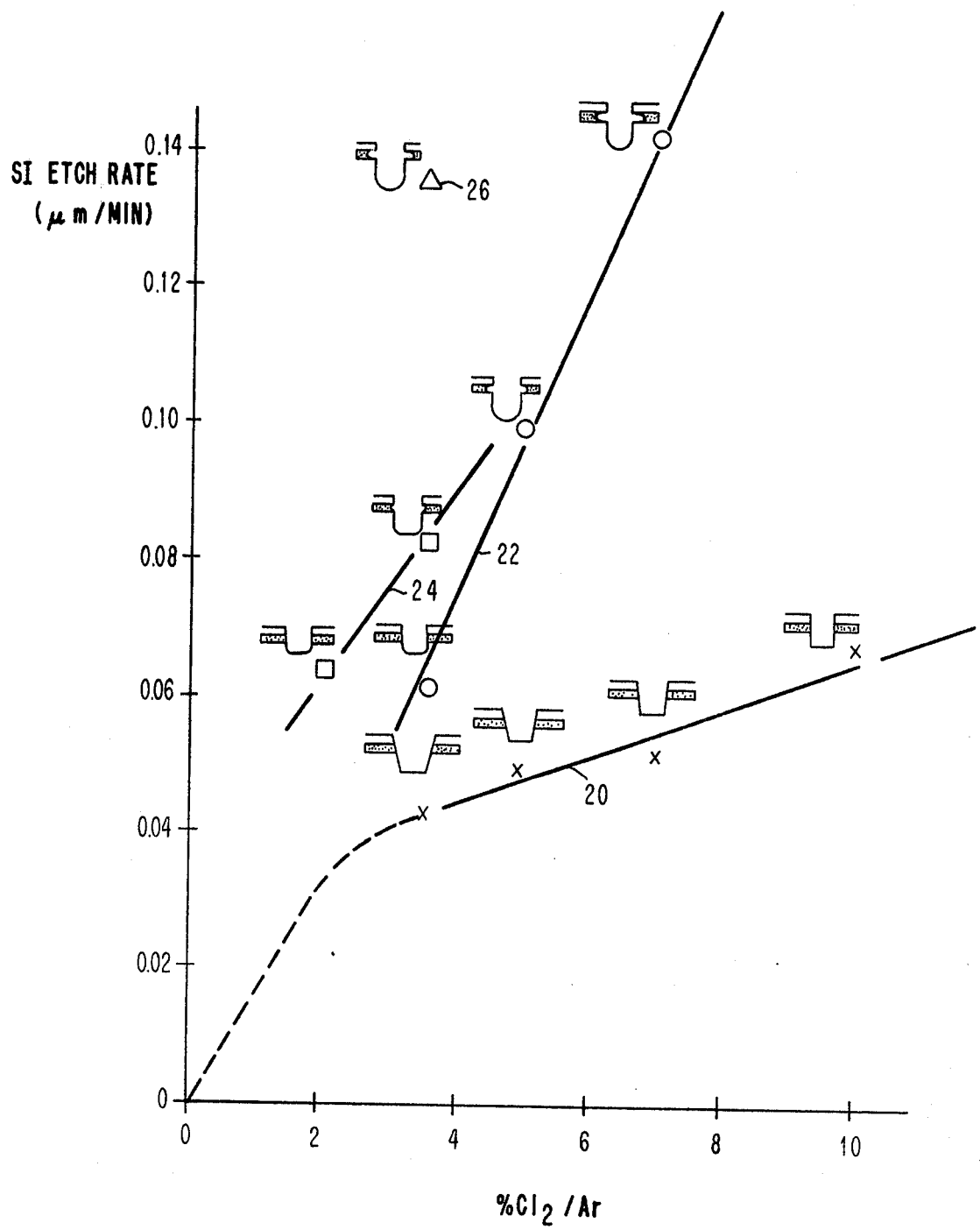
FIG. 2 is a graph showing the problem of overetching highly doped silicon regions at various etching conditions.

The change of etch rates also influences the underetching of highly doped N+ or P+ regions such as region 12. At etch rates of about 0.07 micrometers per minute, vertical grooves with no lateral N+ undercut etching are formed. Lowering the etch rates will cause increasingly more taper, as indicated in FIG. 2. FIG. 2 is a graph which shows the effect of the silicon etch rate in micrometers per minute versus the percent of the chlorine specie in argon for various system pressure conditions. Curve 20 is at a pressure of 10 micrometers. At this pressure and at the etch rates indicated, there is virtually no undercutting in the N+ regions no matter what percent of chlorine specie is used.

The taper of curve 20 goes from virtually vertical sidewalls at 10 percent chlorine specie in argon to a 20° taper from the vertical at about 3 percent chlorine specie in argon. The power is 0.16 watts/cm$^2$ in all of the FIG. 2 experiments and the cathode is silicon dioxide. Curve 22 shows that at an etch rate of 0.06 micrometers per minute and approximately 3 percent chlorine in argon, a vertical sidewall groove is obtained. As one moves up on the curve to the etch rate of 0.10 micrometers per minute and 5 percent chlorine specie in argon, we see undercutting in the N+ region. Further, as we proceed up the curve to 0.14 micrometers per minute and approximately 7 percent chlorine specie in argon, we see extensive undercutting which is very serious. The curve 24 shows the situation at pressures of 40 micrometers; at 2 percent chlorine specie in argon and at about 0.06 micrometer/min. etch rate, the N+ undercutting is not a problem. However, as one moves up the curve to 0.08 micrometers, the undercutting begins to become more apparent. Further up the curve it is expected that further undercutting will occur. The point 26 is reactive etching at 90 micrometers total pressure and shows extensive undercutting which produces an unsatisfactory product. It can be seen from this graph of FIG. 2 that the useful operative pressure range is from about 2 to 50 micrometers with a chlorine specie concentration of between about 2 to 10 percent in the gaseous ambient and an etch rate between about 0.04 and 0.08 micrometers per minute. The chlorine specie which will operate in this manner are $CL_2$, $CCL_4$, $CHCl_3$ and other chlorine containing species.

The key difficulty with the undercutting of the N+ region is that it limits the ability of how close one isolation region can be placed next to another. If significant underetching occurs and two isolation regions are located very close to each other, a total underetch of the region 14 will occur. Furthermore, the N+ collector region will be entirely removed and thus no transistor could be built. A still further problem would occur for any undercut region in that such non-linear tapered grooves would not be properly filled in with chemical vapor deposited dielectric material such as silicon dioxide. The consequence is a filled groove with a buried hole or channel.

Figure 1C:
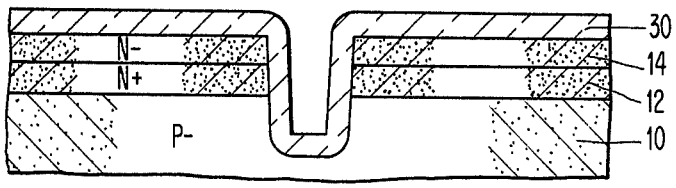

Referring now to FIG. 1C, the next step in the process is to thermally oxidize the openings or channels by subjecting the body to an oxidation ambient which may be for example 970° C in wet oxygen. The body is subjected to the ambient for about 10 to 30 minutes to produce the preferred silicon dioxide thickness within the opening or channel of about 500 to 2000 Angstroms. The purpose of the thermal oxide 30 is to assure good silicon/silicon dioxide interface properties, the qualities of which are usually not as good with chemical vapor deposited dielectric material. Good quality dielectric material is necessary to permit the subsequent abutting of diffused junctions against the dielectric isolation.

The minimum thickness is nominally 500 Angstroms so that a good thermal silicon dioxide layer is formed. Any thinner layer could present difficulties because of pin holes in the oxide and therefore cause electrical integrity problems.

The maximum thickness is primarily dictated by the time required at elevated temperatures. Long times at high temperatures will tend to move any diffused junction within the silicon regions. Very thick oxide films formed at such temperatures will also cause stress problems in the silicon material.

The grown oxide 30 will follow almost precisely the taper of the sidewalls in the opening formed by the reactive ion etching step. The next step, involving the filling of the opening with a suitable dielectric material, is shown completed in FIG. 1D wherein the opening or channel is filled with vapor deposited silicon dioxide layer 32. In order to completely fill the opening or channel, it is necessary to cover the surface of the layer 30 not only in the channel or opening, but completely over the surface of the silicon body. The preferred filling process is a chemical vapor deposition of silicon dioxide using gas mixtures of $CO_2/SiH_4/N_2$ or $N_2O/SiH_4/N_2$ at 800°–1000° C.

Figure 8:
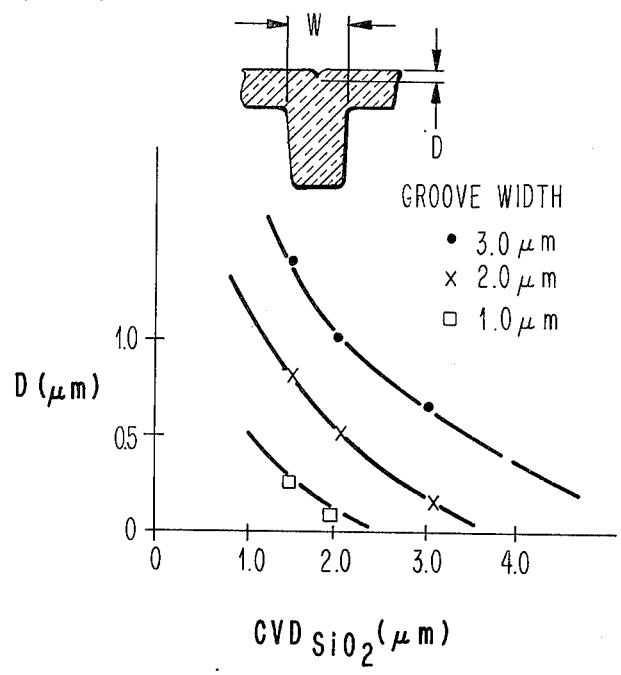
FIGS. 8, 9 and 10 are graphical illustrations which indicate the characteristics of filling the openings with dielectric material.

Typical deposition rates are of the order of 50–100 Angstroms per minute and total deposition thicknesses are nominally 3 micrometers for 2 micrometers wide grooves if a near planar surface is desired. The specific relationship of planarity and chemical vapor deposited silicon dioxide thickness is shown in FIG. 8.

Figure 3:
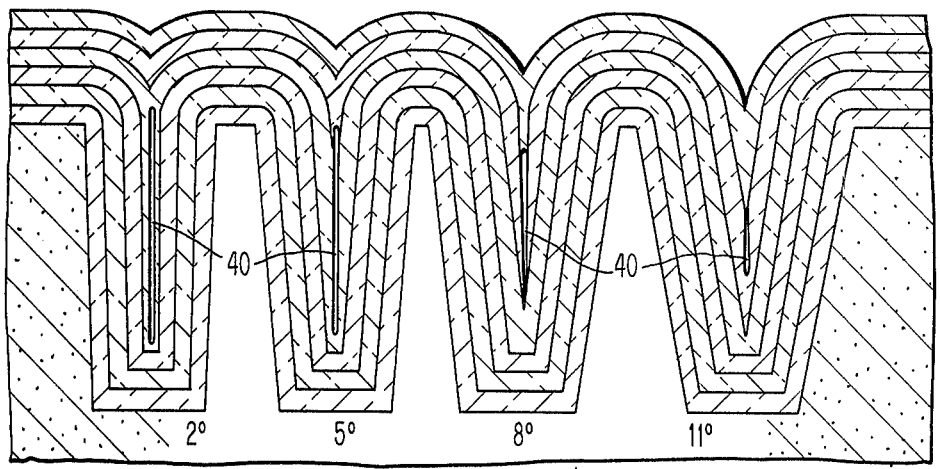
FIGS. 3 and 4 illustrate the problem of filling the tapered hole of varying tapered angles from the vertical.
Figure 4:
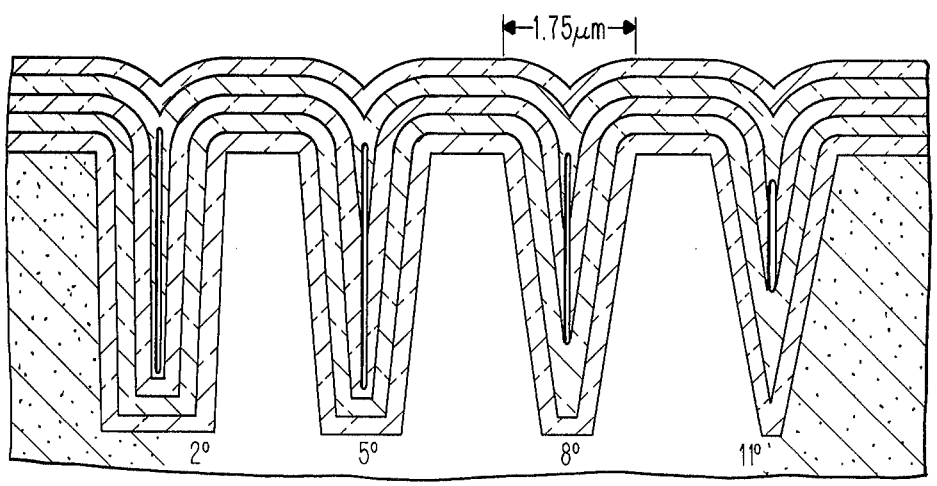
Figure 5:
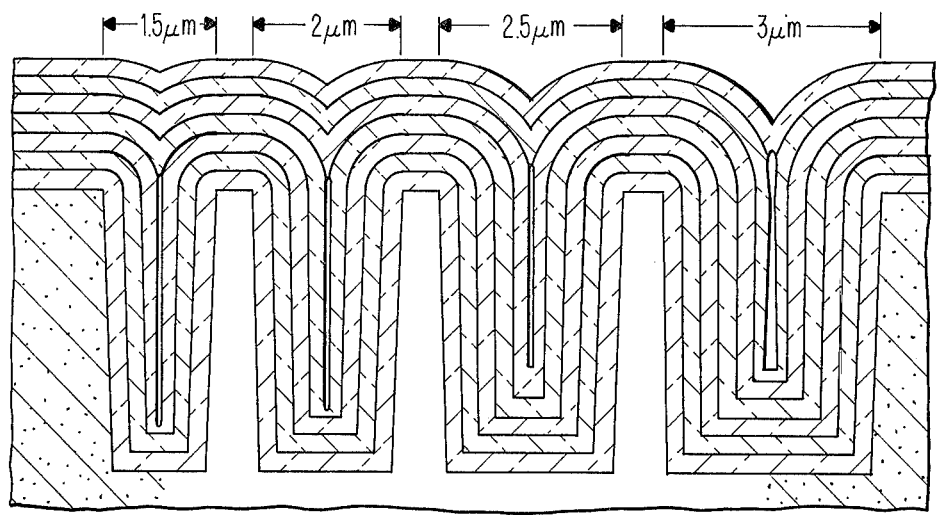
FIG. 5 illustrates the problem of filling tapered holes of one taper from the vertical for different widths of holes.
Figure 6:
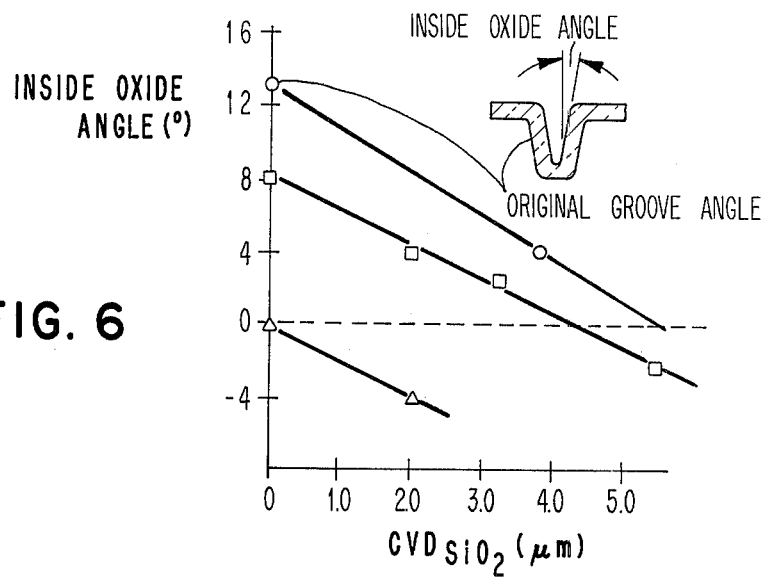
FIG. 6 is experimental data of the groove taper angle change as a function of chemical vapor deposited silicon dioxide filling thickness.

The problems involved in the filling of openings or channels can be more fully appreciated with reference to FIGS. 3, 4 and 5. These figures show the critical importance of the sidewall taper and the problem of size of the opening at the silicon surface. As can be seen in FIG. 3, the center area of the chemical vapor deposited silicon dioxide filled opening shows a small crevice region 40. This crevice is present only after silicon dioxide etching of a cross-sectional surface. The crevice formation implies a poor oxide in that region and experiments indicate that this is caused by the overgrowth of the silicon dioxide over opening dimensions which are less than about 0.2 micrometers in width and having a wall angle of less than about 20°. It has been determined that the tapered angle of the opening decreases as the opening filling progresses (FIG. 6). This can affect the overcoating in different ways. The specific effect being related to the groove width and taper. These effects are shown in FIGS. 3, 4 and 5. They illustrate by a series of lines, which represent equal amounts of chemical vapor deposited silicon dioxide layers, the progression of filling in of the grooves. As can be seen in FIG. 3, the etched out crevice region 40 tends to be buried further down into the filled in groove as the groove width widens and the taper increases. FIG. 4 shows only the taper effect for the same size grooves. Again, the more tapered groove tends to bury the crevice (or poor silicon dioxide region) deeper. FIG. 5 shows the groove width effect for a specific taper angle. As the groove widens, the poor oxide region tends to occur at a higher position.

Figure 7:
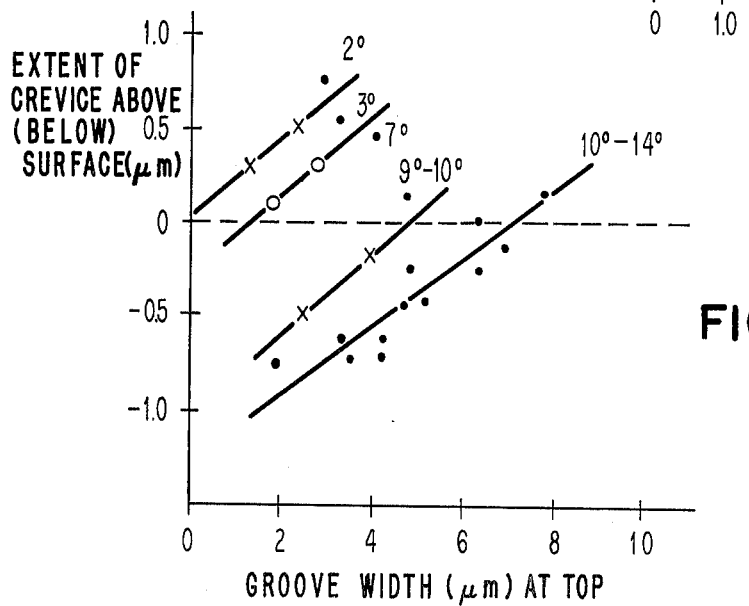
FIG. 7 is experimental data of the extent of crevice above or below the surface versus groove width for different tapers.

These results are summarized in FIG. 7 in which the extent of the crevice above or below the silicon wafer surface is plotted for different groove widths and different taper angles. As is clear, successfully buried poor silicon dioxide regions can be achieved for groove geometries of narrow groove widths and nominal taper angles. As the groove width widens, the taper must be increased accordingly in order to keep the poor oxide buried.

FIG. 6 is experimental data indicating the change of a taper angle of a groove as groove filling proceeds. It is obvious that for vertical grooves, any deposition will cause negative tapered grooves and consequently result in physical silicon dioxide voids.

FIG. 8 is experimental data on the necessary amount of chemical vapor deposited silicon dioxide required to fully planarize the surface over a groove. The amount to achieve this is related to the width of the groove at the top of the groove.

Figure 9:
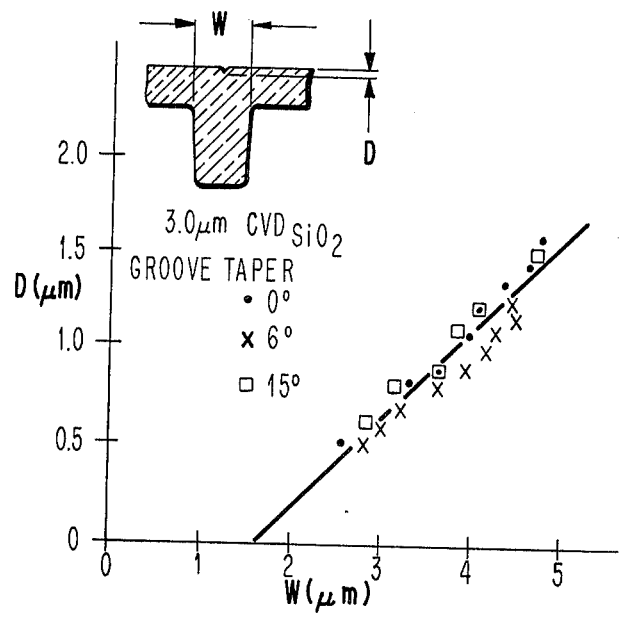

FIG. 9 shows similar experimental data to FIG. 8 on groove filling and planarity and points out that the planarization is strictly dependent on the groove width and not on the taper angle.

Figure 10:
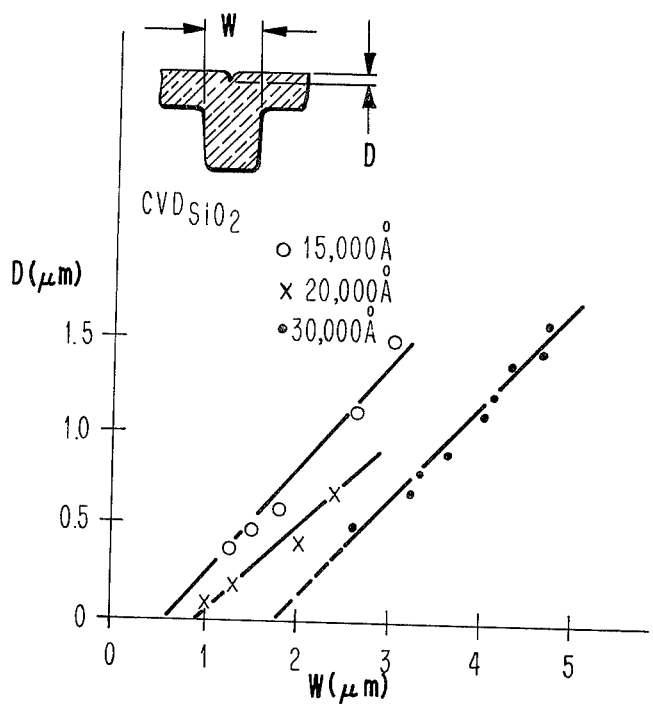

FIG. 10 is still another means of expressing the surface planarity of a filled groove, this time showing the effect of groove width and different overcoating thicknesses.

Figure 1D:
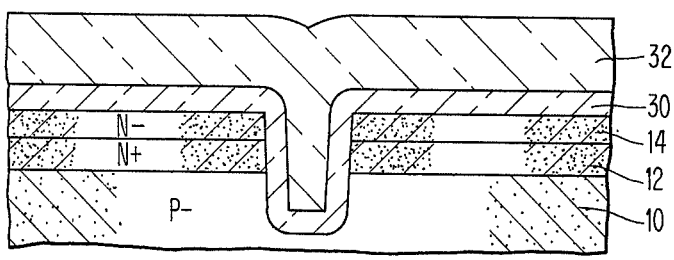
Figure 1E:
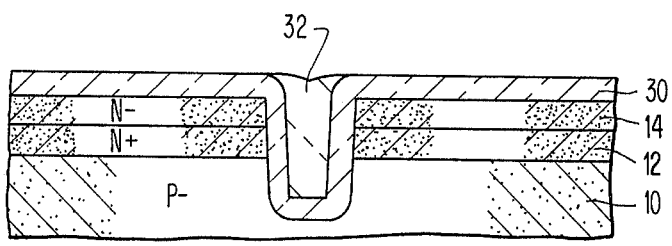

The final step of the process is the reactive ion etching of the silicon dioxide layer 32 shown in FIG. 1D to produce the structure of FIG. 1E. The excess silicon dioxide is conveniently removed by reactive ion etching and with the help of an optical film thickness monitoring system or by the knowledge of the etch rate of the silicon dioxide. The system used for this process would be of the low pressure sputter etch type system with the wafer positioned on a silicon cathode cover plate. A fluorinated hydrocarbon such as $CF_4$ would be used as an etchant so that an $SiO_2/Si$ ratio of approximately 1:1 results. The gas pressure could run from 10 to 70 micrometers with gas flow rates of 2 to 50 cc/min. The RF power level would run from 0.1 watts/cm$^2$ to 0.5 watts/cm$^2$.

The result of the reactive ion etch thinning of the silicon dioxide layer is the possible exposure of the inadequately buried poor oxide region in the center of the groove. This is a potential problem because any chemical wet etching of the wafer surface with such exposed regions of poor silicon dioxide would cause crevice formation in those regions. Such crevices could become potential traps for dirt or process residues and could negatively influence the device characteristics.

An alternative embodiment to overcome some of the undercutting problems would be to form a highly doped region 12 in a manner that this region would be interrupted and set back from the areas where the openings or channels are to be formed. Therefore, a lower doped region of P−, which is to be reactive ion etched, would surround the region. Thus, there would be no undercutting problem. This alternative requires special oxidation and photolithographic and etching steps to allow for this interrupted region.

The formation of a P+ region underneath the isolation region may be useful when the substrate is P−. In such cases, the P− region has a tendency to change its resistivity, even to the extent of inverting to N-type material, when it is thermally oxidized. A P+ implant prevents such inversion possibility. This may be formed by use of a P+ ion implantation of a dopant such as boron before the thermal oxidation step of the groove. The preferred technique is the use of a thin chemical vapor deposited silicon dioxide coating of the groove. Such coating of between about 500 to 800 Angstroms will permit the implantation of for example, boron, through the bottom of the groove into the silicon, but not through the silicon dioxide on the tapered walls. This is true since the slanted walled silicon dioxide represents a much thicker silicon dioxide than its actual thickness because of the directionality of the 90° implanting ions. After the implantation and appropriate annealing, the chemical vapor deposited silicon dioxide is removed and the normal process sequence (i.e. FIG. 1C) is taken up.

Another approach to modify the fabrication process is to utilize a heat anneal in a steam atmosphere of the sample after process step FIG. 1E. This anneal at about 900°–950° C would be to convert any exposed poor quality silicon dioxide in the center region of the groove to a good quality silicon dioxide. The benefit of this process modification is that the taper angle does not become as important for assuring buried poor quality silicon dioxide regions and therefore permits higher device density fabrication. This process can cure poor silicon dioxide in, for example, the smaller taper angles, such as 2° to 4°.

While the invention has been particularly shown and described with reference to the preferred embodiments thereof, it will be understood by those skilled in the art that various changes in form and detail may be made therein without departing from the spirit and scope of the invention. For example, devices other than a bipolar transistor could be used advantageously in the isolated monocrystalline silicon pockets formed by the process. Such devices would include passive devices such as resistors and active devices such as MOSFET devices.

What is claimed is:

1. A method for isolating regions of silicon comprising:
   providing a silicon body composed principally of one conductivity;
   forming tapered sided openings of less than about 4 micrometers in width at the surface in said body by reactive ion etching;
   the taper of said tapered sided openings being greater than about 2° from the vertical and terminating into the substantially flat bottom of said openings;
   thermally oxidizing the surfaces of said openings;
   filling said thermally oxidized openings with a dielectric material wherein the said regions of silicon are isolated; and
   removing said dielectric material from above the surface of said body wherein the said openings are uniformly filled at the said surface.

2. The method of claim 1 wherein said silicon body contains a layer of highly doped silicon and said openings extend through said layer.

3. The method of claim 2 wherein said openings are formed in a silicon reactive chlorine specie ambient having a pressure of between about 2 and 50 micrometers, said chlorine specie in said ambient being between about 2 and 10 percent, and the etch rate between about 0.03 and 0.08 micrometers per minute.

4. The method of claim 3 wherein the power applied for said reactive ion etching is between about 0.1 and 0.75 watts/cm$^2$.

5. The method of claim 3 wherein the said chlorine specie is chlorine gas and the said chlorine in said ambient is between about 2 and 8 percent.

6. The method of claim 3 wherein the remaining gas component of said ambient is argon.

7. The method of claim 1 wherein said taper is between about 2° to 20° from the vertical.

8. The method of claim 1 wherein less than 2000 Angstroms of silicon dioxide is formed by said thermally oxidizing the surfaces of said openings.

9. The method of claim 1 wherein said dielectric layer is silicon dioxide and it is deposited by chemical vapor deposition.

10. The method of claim 9 wherein between about 1 and 5 micrometers of said dielectric layer is deposited.

11. The method of claim 1 wherein said dielectric material is removed by reactive ion etching.

12. The method of claim 1 wherein a silicon dioxide mask is used for said reactive ion etching of silicon and said mask has a tapered silicon dioxide opening of about 5° to 20° from the vertical.

13. A method for isolating regions of silicon comprising:
   providing a silicon body composed principally of one conductivity and having a layer of highly doped silicon;
   etching tapered sided openings in said body and through said highly doped layer in a silicon reactive chlorine specie ambient having a pressure of between about 2 to 50 micrometers, chlorine specie of gas between about 2 to 10 percent, and etch rate between about 0.03 and 0.08 micrometers per minute;
   thermally oxidizing the surfaces of said openings;
   filling said thermally oxidized openings with a dielectric material wherein the said regions of silicon are isolated.

14. The method of claim 13 wherein the power applied for said etching is between about 0.1 to 0.75 watts/cm$^2$.

15. The method of claim 13 wherein the said chlorine specie is chlorine gas and the said chlorine in said ambient is about 2 to 8 percent.

16. The method of claim 15 wherein the remaining component of said ambient is argon.

17. The method of claim 13 wherein the said layer of highly doped silicon has a doping level greater than about $2 \times 10^{19}$ atoms/cc.

18. The method of claim 13 wherein said highly doped layer is within the said silicon body.

19. The method of claim 13 wherein the said dielectric material is removed from above the surface of said body wherein the said openings are uniformly filled at the said surface.

20. The method of claim 19 wherein a further heating of said structure at a temperature of about 900° to 950° C to improve the structure of said dielectric material.

21. The method of claim 18 wherein a said layer is N+, said body is P and a P+ implant is made at the bottom of said openings prior to said thermally oxidizing said openings.

* * * * *